United States Patent
Li

(10) Patent No.: US 11,309,366 B2
(45) Date of Patent: Apr. 19, 2022

(54) RESISTIVE TOUCH SCREEN, ORGANIC LIGHT EMITTING DIODE DISPLAY, AND MANUFACTURING METHOD THEREOF

(71) Applicant: WUHAN CHINA STAR OPTOELECTRONICS SEMICONDUCTOR DISPLAY TECHNOLOGY CO., LTD., Wuhan (CN)

(72) Inventor: Wangming Li, Wuhan (CN)

(*) Notice: Subject to any disclaimer, the term of this patent is extended or adjusted under 35 U.S.C. 154(b) by 422 days.

(21) Appl. No.: 16/468,010

(22) PCT Filed: Feb. 25, 2019

(86) PCT No.: PCT/CN2019/076068
§ 371 (c)(1),
(2) Date: Jun. 10, 2019

(87) PCT Pub. No.: WO2020/124784
PCT Pub. Date: Jun. 25, 2020

(65) Prior Publication Data
US 2021/0225947 A1    Jul. 22, 2021

(30) Foreign Application Priority Data
Dec. 19, 2018 (CN) .......................... 201811562430.7

(51) Int. Cl.
*H01L 27/32* (2006.01)
*G06F 3/045* (2006.01)
*H01L 51/00* (2006.01)
*H01L 51/56* (2006.01)

(52) U.S. Cl.
CPC ............ *H01L 27/323* (2013.01); *G06F 3/045* (2013.01); *H01L 51/0004* (2013.01); *H01L 51/56* (2013.01); *G06F 2203/04103* (2013.01)

(58) Field of Classification Search
None
See application file for complete search history.

(56) References Cited

U.S. PATENT DOCUMENTS

| | | | |
|---|---|---|---|
| 2015/0311012 A1* | 10/2015 | Wada | H01L 41/1132 200/514 |
| 2015/0378483 A1* | 12/2015 | Tachikawa | G06F 3/04142 345/174 |
| 2016/0364070 A1 | 12/2016 | Chen et al. | |
| 2017/0010703 A1* | 1/2017 | Chen | G02F 1/136286 |
| 2017/0010704 A1* | 1/2017 | Chen | G02F 1/133514 |
| 2018/0175297 A1* | 6/2018 | Zhou | B82Y 10/00 |

FOREIGN PATENT DOCUMENTS

| | | | |
|---|---|---|---|
| CN | 105094441 A | | 11/2015 |
| CN | 106293419 A | | 1/2017 |
| CN | 107128090 A | * | 9/2017 |
| CN | 107128090 A | | 9/2017 |
| CN | 207764760 U | | 8/2018 |
| JP | 2007122568 A | | 5/2007 |

* cited by examiner

Primary Examiner — Kirk W Hermann

(57) ABSTRACT

A resistive touch screen includes: a cover plate; conductive traces formed on the cover plate; a carbon resistance layer printed on the cover plate between the conductive traces, wherein the conductive traces are electrically connected to the carbon resistance layer to form an inductive resistive layer, and a resistance value can be changed by external pressure to achieve touch control.

12 Claims, 2 Drawing Sheets

RESISTIVE TOUCH SCREEN, ORGANIC LIGHT EMITTING DIODE DISPLAY, AND MANUFACTURING METHOD THEREOF

BACKGROUND OF INVENTION

Field of Invention

The present invention relates to a field of display technologies, and in particular, to a touch screen, an organic light emitting diode (OLED) display, and a method of manufacturing the same.

Description of Prior Art

At present, touch screens of smart devices such as mobile phones and tablets commonly use capacitive touch. Capacitive touch can be realized mainly by two technologies: the first technique is one glass solution (OGS) technology, which is to etch touch sensors and driving lines on a cover plate glass; and the second technique is to etch touch lines on a film material, and then a touch screen portion is attached to a cover plate glass through an optical glue.

However, capacitive touch screens must use conductors to achieve pressure sensing. Non-conductors cannot achieve touch-control. For example, a user must use a professional capacitive pen to achieve the touch-control of a screen after wearing insulated gloves. Moreover, touch failure of the capacitive touch screens may happen in high temperature or cold environments. In addition, the touch lines in the capacitive touch screen are etched on the cover plate glass or a film, resulting in a great limitation on flexible bending of an organic light emitting diode (OLED), thereby greatly limiting the degree of curvature of a display screen surface.

SUMMARY OF INVENTION

An embodiment of the present invention provides a touch screen, an organic light emitting diode (OLED) display, and a manufacturing method thereof, so as to solve the problem that the existing capacitive touch screen has a narrow use range and cannot realize large angle bending.

An embodiment of the present invention provides a resistive touch screen, including: a cover plate; a plurality of conductive traces formed on the cover plate; and a carbon resistance layer printed on the cover plate between the conductive traces, wherein the conductive traces are electrically connected to the carbon resistance layer to form an inductive resistive layer.

Further, a resistive region is disposed on the cover plate between the conductive traces, and the carbon resistance layer is printed in the resistive region.

Further, a material of the carbon resistance layer is fullerene, and the cover plate is a flexible cover plate.

An embodiment of the present application further provides an organic light emitting diode (OLED) display, including an organic light emitting diode (OLED) display panel and a resistive touch screen.

The resistive touch screen is attached to the OLED display panel, and the resistive touch screen includes: a cover plate; a plurality of conductive traces formed on the cover plate; and a carbon resistance layer printed on the cover plate between the conductive traces, wherein the conductive traces are electrically connected to the carbon resistance layer to form an inductive resistive layer.

Further, a resistive region is disposed on the cover plate between the conductive traces, and the carbon resistance layer is printed in the resistive region.

Further, a material of the carbon resistance layer is fullerene, and the cover plate is a flexible cover plate.

An embodiment of the present invention further provides a method for manufacturing a resistive touch screen, including: providing a cover plate; forming a plurality of conductive traces on the cover plate; and printing a carbon resistance layer on the cover plate between the conductive traces, such that the conductive traces are electrically connected to the carbon resistance layer to form an inductive resistive layer.

Further, forming the conductive traces on the cover plate specifically includes: depositing an indium tin oxide (ITO) layer on the cover plate using a magnetron sputtering process; and etching the conductive traces out of the ITO layer using a laser etching process.

Further, printing the carbon resistance layer on the cover plate between the conductive traces specifically includes: providing a resistive region on the cover plate between the conductive traces; and printing a carbon resistance layer on the resistive region.

Further, printing the carbon resistance layer on the resistive region specifically includes: printing the carbon resistance layer on the resistive region using a surface-mount technology (SMT) printing process.

Further, before forming the conductive traces on the cover plate, the method further includes: performing plasma cleaning to the cover plate to remove foreign matter on a surface of the cover plate, such that a water contact angle on the surface of the cover plate reaches a printing requirement of the carbon resistance layer; and after printing the carbon resistance layer on the cover plate between the conductive traces, the method further including: baking the carbon resistance layer to cure the carbon resistance layer.

Further, a material of the carbon resistance layer is fullerene, and the cover plate is a flexible cover plate.

The invention has the beneficial effects of forming conductive traces on a cover plate, printing a carbon resistance layer on the cover plate between the conductive traces, electrically connecting the conductive traces and the carbon resistance layer to form an inductive resistance layer, thereby changing a value of resistance by external pressure to realize touch-control, such that applicable range of the touch screen is improved, and arbitrary bending of the touch screen can be realized, while the structure is simple and the price is low.

BRIEF DESCRIPTION OF DRAWINGS

The technical solutions and other advantageous effects of the present invention will be apparent from the detailed description of embodiments of the present invention.

DETAILED DESCRIPTION OF PREFERRED EMBODIMENTS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

Figure 1:
FIG. 1 is a front view of a resistive touch screen provided by an embodiment of the present invention.

As shown in FIG. 1, FIG. 1 is a schematic structural diagram of a resistive touch screen provided by an embodiment of the present invention, wherein the resistive touch screen includes a cover plate 10 and an inductive resistance layer 13 formed on the cover plate.

Figure 2:
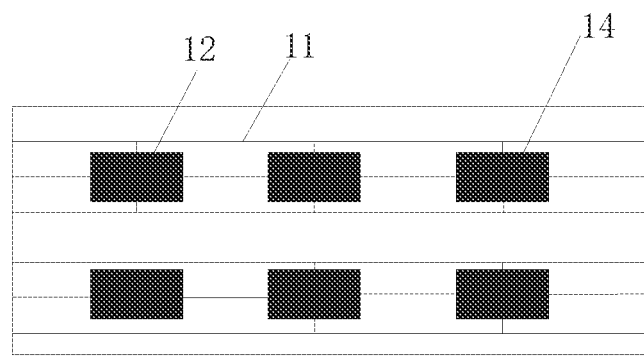
FIG. 2 is a top view of a resistive touch screen provided by an embodiment of the present invention.

As shown in FIG. 2, the inductive resistance layer 13 includes conductive traces 11 and a carbon resistance layer 12. The conductive traces 11 are formed on a surface of the cover plate 10, and the conductive traces 11 can be designed according to product requirements, that is, the conductive traces formed on the cover plate 10 may vary according to different product requirements. In a specific embodiment, the conductive traces 11 are formed on the cover plate 10 by etching of an indium tin oxide (ITO) layer (indium tin oxide semiconductor transparent conductive film) on the cover plate 10.

Spaces between the conductive traces 11 are hollowed out to expose the cover plate 10, and a resistive region 14 is disposed on the exposed cover plate 10, while a carbon resistive layer 12 is printed on the surface of the cover plate 10 at the resistive region 14. The resistive region 14 can be designed differently according to different product requirements, such that an arrangement of the carbon resistance layers between the conductive traces may be pre-designed, and the resistive region can be designed according to the arrangement of the carbon resistance layer. In a specific embodiment, the carbon resistive layer 12 is printed on the resistive region 14 using a surface-mount technology (SMT) printing process. Because the carbon resistive layer is formed on the cover plate by printing, there is no limitation on the degree of bending of the cover plate, and the cover plate can be either a rigid cover plate, such as a cover plate glass, or a flexible cover plate, such as an ultra-thin glass cover plate which is a cover plate made of a bendable material. The flexible cover plate can realize arbitrary bending of the touch screen and expand the use range of the touch screen. Further, the carbon resistance layer is inexpensive, and thus the manufacturing cost can be reduced. In addition, the speed of a printing machine for printing the carbon resistance layer can reach 20 S/PCS, thereby reducing the production failure rate while improving the production efficiency.

The carbon resistive layer 12 is electrically connected to the conductive traces 11 to form an inductive resistance layer. Material of the carbon resistance layer 12 is fullerene C60. An atomic structure of fullerene is spherical, having a laminated molecule structure. When the fullerene is subjected to external pressure, an atom is deformed, causing the volume of a single layer to change, resulting in a change in the resistance value. In addition, the external pressure causes a connection between layers inside the molecule, resulting in a change in a molecular structure, which can also cause changes in the resistance value. A driver responds according to the magnitude and position of the resistance variation, thereby implementing touch-control. This embodiment can be applied to many areas where capacitive touch-control is restricted, such as touch-control on a surface of a metal casing of an automobile, touch-control on a smart door and window, touch-control on a metal panel of a range hood, a large-sized touch television, and touch-control on a surface of an outdoor public facility etc.

It can be seen from the above that the conductive traces are formed on the cover plate of the resistive touch screen provided in this embodiment, and the carbon resistance layer is printed on the cover plate between the conductive traces to electrically connect the conductive traces and the carbon resistance layer to form the inductive resistance layer, thereby changing a value of resistance by external pressure to realize touch-control, while the touch sensing can be realized without using a conductor, and can be used at a high temperature and cold environment, thereby effectively improving the applicable range of the touch screen; and arbitrary bending of the touch screen can be realized; eliminating the need for a polarizing plate and a touch pad in a capacitive touch screen. In addition, the carbon resistance layer and conductive traces which are inexpensive are used to form an inductive resistive layer, simplifying a touch screen structure and reducing cost.

Figure 3:
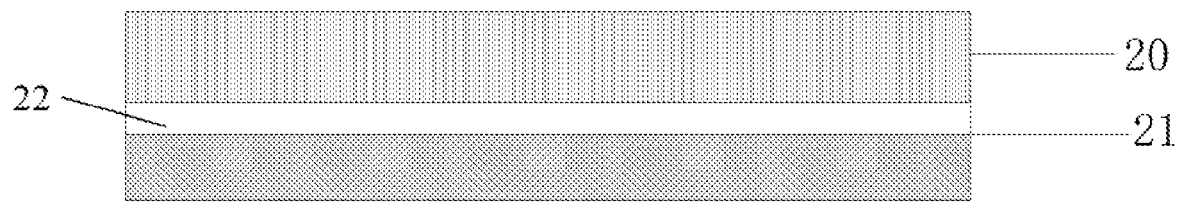
FIG. 3 is a front view of an organic light emitting diode (OLED) display of an embodiment of the present invention.

As shown in FIG. 3, FIG. 3 is a schematic structural diagram of an organic light emitting diode (OLED) display provided by an embodiment of the present invention, wherein the OLED display includes an OLED display panel 20 and a resistive touch screen 21. The resistive touch screen 21 is the same as the above-mentioned resistive touch screen, and details are not repeated herein for brevity.

The resistive touch screen 21 is attached to the OLED display panel 20. In a specific embodiment, the OLED display panel is bonded with an optical glue 22, and the resistive touch screen 21 is attached to the OLED display panel 20 by a three-dimensional (3D) lamination process.

This embodiment can realize arbitrary bending of the OLED display, effectively improve the applicable range of the OLED display, and the OLED display of the embodiment has a simple structure and low price.

Figure 4:
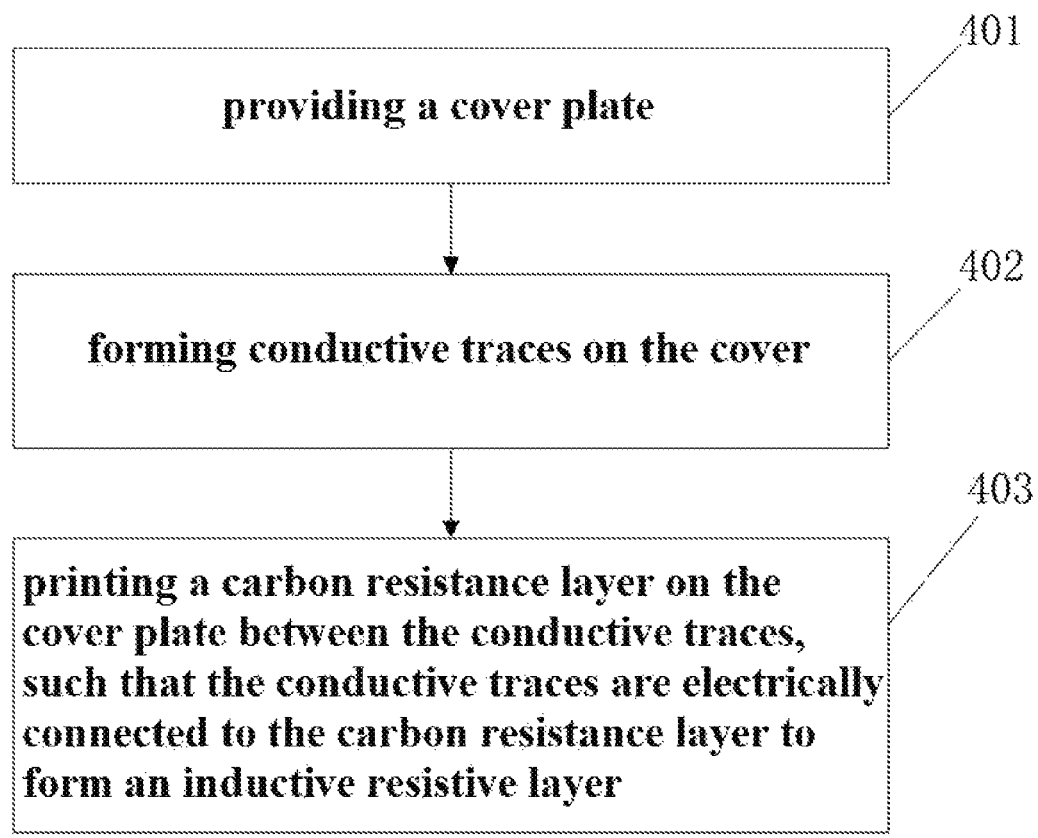
FIG. 4 is a schematic flow chart of a method for manufacturing a resistive touch screen of an embodiment of the present invention.

As shown in FIG. 4, FIG. 4 is a schematic flowchart of a method for manufacturing a resistive touch screen of an embodiment of the present invention, and the manufacturing method may include the following steps:

401. providing a cover plate.

In this embodiment, the cover plate may be a rigid cover plate, such as a cover plate glass, or a flexible cover plate, such as an ultra-thin glass cover plate, which is a cover plate made of a bendable material. The flexible cover plate can realize arbitrary bending of the touch screen, thereby expanding the use range of the touch screen.

402. forming conductive traces on the cover plate.

In this embodiment, the conductive traces can be designed differently according to different product requirements. The conductive traces can be pre-designed before the touch screen is manufactured.

Specifically, forming conductive traces on the cover plate includes: depositing an indium tin oxide (ITO) layer on the cover plate using a magnetron sputtering process; and etching the conductive traces out of the ITO layer.

It should be noted that the ITO layer is deposited on the cover plate by a magnetron sputtering process, and the ITO layer is etched by a laser etching process to etch pre-designed conductive traces on a surface of the cover plate, to form a trace layer on the surface of the cover plate. The ITO between the conductive traces is etched away to form a hollowed-out region between the conductive traces to expose the corresponding cover plate.

403. printing a carbon resistance layer on the cover plate between the conductive traces, such that the conductive traces are electrically connected to the carbon resistance layer to form an inductive resistive layer.

In this embodiment, the carbon resistance layer can be designed in different arrangements according to different product requirements. The arrangement of the carbon resistance layers between the conductive traces can be designed in advance before the touch screen is manufactured. In a specific embodiment, material of the carbon resistance layer is fullerene C60.

The conductive traces on the cover plate and the carbon resistance layer are electrically connected to form the inductive resistive layer on the cover plate, thereby obtaining the resistive touch screen, and the touch-control is realized by changing the value of the resistance by external pressure.

In addition, because the carbon resistive layer is formed on the cover plate by printing, there is no limitation on the degree of bending of the cover plate, and the carbon resistance layer is inexpensive, and thus the manufacturing cost can be reduced. In addition, the speed of the printing machine for printing the carbon resistance layer can reach 20 S/PCS, thereby reducing the production failure rate while improving the production efficiency.

Specifically, printing the carbon resistance layer on the cover plate between the conductive traces includes: providing a resistive region on the cover plate between the conductive traces; and printing the carbon resistance layer on the resistive region.

It should be noted that spaces between the conductive traces are hollowed out to expose the cover plate, and the resistive region is disposed on the exposed cover plate, while the carbon resistive layer is printed on the surface of the cover plate at the resistive region. The resistive region can be designed in advance according to an arrangement of the carbon resistance layer between the conductive traces.

When printing the carbon resistance layer, it is preferred to print the carbon resistance layer on the resistive region using a surface-mount technology (SMT) printing process. Specifically, a stencil is disposed above the cover plate and maintains a certain distance from the cover plate, and then carbon resistance ink is poured on a starting position of a squeegee above the stencil, thereby making the squeegee to uniformly print the carbon resistance ink according to fixed pressure and speed to a surface of the cover plate in the resistive area to form a carbon resistance layer that meets the pre-design.

Further, before forming the conductive traces on the cover plate, the method further includes: performing plasma cleaning to the cover plate to remove foreign matter on the surface of the cover plate, such that a water contact angle on the surface of the cover plate reaches a printing requirement of the carbon resistance layer.

It should be noted that foreign matter on the surface of the cover plate may lead to a large error in the carbon resistance layer after printing. When the water contact angle on the surface of the cover plate is too large, the carbon resistance layer may not have a good contact quality and cannot be completely printed on the surface of the cover plate. As such, after the cover plate is obtained, the cover plate needs to be cleaned so that there is no foreign matter on the surface of the cover plate, and the water contact angle on the surface of the cover plate meets the requirements of carbon resistance printing.

Further, after printing the carbon resistance layer on the cover plate between the conductive traces, the method further includes: baking the carbon resistance layer to cure the carbon resistance layer.

It should be noted that because the carbon resistance ink is in a liquid state, after the carbon resistance layer is printed on the cover plate, the carbon resistance layer is baked to cure the carbon resistance layer.

In addition, after the resistive touch screen is manufactured, the resistive touch screen can be attached to the OLED display panel to which the optical adhesive has been attached by using a 3D bonding technology to obtain an organic light emitting diode (OLED) display.

It can be seen from the above that the conductive traces are formed on the cover plate of the resistive touch screen provided in this embodiment, and the carbon resistance layer is printed on the cover plate between the conductive traces to electrically connect the conductive traces and the carbon resistance layer to form an inductive resistance layer, thereby changing a value of resistance by external pressure to realize touch-control, while the touch sensing can be realized without using a conductor, and can be used at a high temperature and cold environment, thereby effectively improving the applicable range of the touch screen; and arbitrary bending of the touch screen can be realized; eliminating the need for a polarizing plate and a touch pad in a capacitive touch screen. In addition, the carbon resistance layer and conductive traces which are inexpensive are used to form the inductive resistive layer, thus simplifying the manufacturing process and improving the production efficiency.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. A resistive touch screen, comprising:
   a cover plate;
   a plurality of conductive traces formed on the cover plate; and
   a carbon resistance layer printed on the cover plate at spaces confined between the conductive traces,
   wherein the conductive traces are electrically connected to the carbon resistance layer to form an inductive resistive layer.

2. The resistive touch screen of claim 1, further comprising a resistive region disposed on the cover plate between the conductive traces, and the carbon resistance layer is printed in the resistive region.

3. The resistive touch screen of claim 1, wherein material of the carbon resistance layer is fullerene, and the cover plate is a flexible cover plate.

4. An organic light emitting diode (OLED) display, comprising an OLED display panel and a resistive touch screen, wherein the resistive touch screen is attached to the OLED display panel, and the resistive touch screen comprises:
   a cover plate;
   a plurality of conductive traces formed on the cover plate; and
   a carbon resistance layer printed on the cover plate at spaces confined between the conductive traces,
   wherein the conductive traces are electrically connected to the carbon resistance layer to form an inductive resistive layer.

5. The OLED display of claim 4, further comprising a resistive region disposed on the cover plate between the conductive traces, and the carbon resistance layer is printed in the resistive region.

6. The OLED display of claim 4, wherein material of the carbon resistance layer is fullerene, and the cover plate is a flexible cover plate.

7. A method for manufacturing a resistive touch screen, comprising:
   providing a cover plate;
   forming a plurality of conductive traces on the cover plate; and
   printing a carbon resistance layer on the cover plate at spaces confined between the conductive traces, such that the conductive traces are electrically connected to the carbon resistance layer to form an inductive resistive layer.

8. The method of manufacturing the resistive touch screen of claim 7, wherein forming the conductive traces on the cover plate comprises:
   depositing an indium tin oxide (ITO) layer on the cover plate using a magnetron sputtering process; and
   etching the conductive traces out of the ITO layer using a laser etching process.

9. The method of manufacturing the resistive touch screen of claim 7, wherein printing the carbon resistance layer on the cover plate between the conductive traces comprises:
   providing a resistive region on the cover plate between the conductive traces; and
   printing the carbon resistance layer on the resistive region.

10. The method of manufacturing the resistive touch panel of claim 9, wherein printing the carbon resistance layer on the resistive region comprises:
    printing the carbon resistance layer on the resistive region using a surface-mount technology (SMT) printing process.

11. The method of manufacturing the resistive touch screen of claim 7, before forming the conductive traces on the cover plate, the method further comprising:
    performing plasma cleaning to the cover plate to remove foreign matter on a surface of the cover plate, such that a water contact angle on the surface of the cover plate reaches a printing requirement of the carbon resistance layer; and
    after printing the carbon resistance layer on the cover plate between the conductive traces, the method further comprising:
    baking the carbon resistance layer to cure the carbon resistance layer.

12. The method of manufacturing the resistive touch screen of claim 7, wherein material of the carbon resistance layer is fullerene, and the cover plate is a flexible cover plate.

* * * * *